United States Patent
Bang et al.

(10) Patent No.: US 8,436,376 B2
(45) Date of Patent: May 7, 2013

(54) ORGANIC LIGHT EMITTING DIODE DISPLAY

(75) Inventors: Hyun-Chol Bang, Yongin (KR); Won-Kyu Kwak, Yongin (KR); Se-Ho Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 24 days.

(21) Appl. No.: 13/098,104

(22) Filed: Apr. 29, 2011

(65) Prior Publication Data

US 2011/0303930 A1 Dec. 15, 2011

(30) Foreign Application Priority Data

Jun. 11, 2010 (KR) ................ 10-2010-0055626

(51) Int. Cl.
*H01L 27/15* (2006.01)

(52) U.S. Cl.
USPC ................ 257/91; 257/E27.12

(58) Field of Classification Search .......... None
See application file for complete search history.

(56) References Cited

U.S. PATENT DOCUMENTS

| | | | |
|---|---|---|---|
| 2002/0011783 A1* | 1/2002 | Hosokawa | 313/504 |
| 2004/0178722 A1* | 9/2004 | Cok et al. | 313/506 |
| 2006/0158095 A1* | 7/2006 | Imamura | 313/500 |
| 2006/0255726 A1* | 11/2006 | Kim | 313/506 |
| 2007/0108899 A1* | 5/2007 | Jung et al. | 313/506 |
| 2010/0035503 A1* | 2/2010 | Kim et al. | 445/25 |

FOREIGN PATENT DOCUMENTS

| | | |
|---|---|---|
| JP | 2006-201421 | 8/2006 |
| KR | 1020040080729 A | 9/2004 |
| KR | 1020040085459 A | 10/2004 |
| KR | 10-0662557 | 12/2006 |
| KR | 100829753 B1 | 5/2008 |
| KR | 1020100047457 | 5/2010 |

* cited by examiner

*Primary Examiner* — Thomas L Dickey
*Assistant Examiner* — Joseph Schoenholtz
(74) *Attorney, Agent, or Firm* — Knobbe Martens Olson & Bear LLP

(57) ABSTRACT

An organic light emitting diode (OLED) display is disclosed. The organic light emitting diode (OLED) display includes an organic light emitter that has a first electrode, an organic emission layer, and a second electrode. The OLED also has an encapsulation substrate covering the organic light emitter and an assistance electrode disposed between the encapsulation substrate and the second electrode. The assistance electrode can be disposed in a non-light-emitting region between the organic light emitter and the second electrode, and can have a lower resistance than a resistance of the second electrode.

16 Claims, 5 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2010-0055626 filed in the Korean Intellectual Property Office on Jun. 11, 2010, the entire content of which is incorporated herein by reference.

BACKGROUND

1. Field

The described technology relates to an organic light emitting diode (OLED) display improving a drop of a common voltage ELVss in a cathode in a front light emitting structure.

2. Description of the Related Technology

An organic light emitting diode display is a self emissive display that displays an image using an organic light emitting diode for emitting light. Light is generated by energy created when excitons, that are generated by coupling of electrons and holes within an organic emission layer, drop from an excited state to a ground state, whereby the OLED display displays an image using the generated light.

Organic light emitting diode (OLED) displays can be classified into a rear light emitting type and a front light emitting type. In the rear light emitting type, the cathode functions as a reflective layer. Accordingly, the cathode is typically made of a material having low resistance and a large thickness such that an IR drop of the common voltage ELVss can be minimized in the cathode. In the front light emitting type, the cathode functions as a transmissive layer, and is generally formed of a transparent material having a small thickness and low resistivity to increase its transmittance. Accordingly, the voltage drop is generally increased in the cathode due to the high resistance. The rear light emitting type can be more advantageous for an organic light emitting diode (OLED) display of a large size (for example, more than 10 inches).

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode (OLED) display including: a substrate main body, a driving circuit formed over the substrate main body, an organic light emitter including a first electrode, an organic emission layer, and a second electrode, where the first electrode, the organic emission layer and the second electrode are sequentially deposited on the driving circuit, an encapsulation substrate covering the organic light emitter and sealed to the substrate main body, and an assistance electrode disposed between the encapsulation substrate and the second electrode, disposed in a non-light-emitting region between the organic light emitter and the second electrode, where the assistance electrode has a lower resistance than the second electrode.

Another aspect is an organic light emitting diode (OLED) display including: an organic light emitter including a first electrode, an organic emission layer, and a second electrode, an encapsulation substrate covering the organic light emitter, an assistance electrode disposed between the encapsulation substrate and the second electrode, disposed in a non-light-emitting region between the organic light emitter and the second electrode, where the assistance electrode has a lower resistance than a resistance of the second electrode.

DETAILED DESCRIPTION OF CERTAIN INVENTIVE EMBODIMENTS

Figure 1:
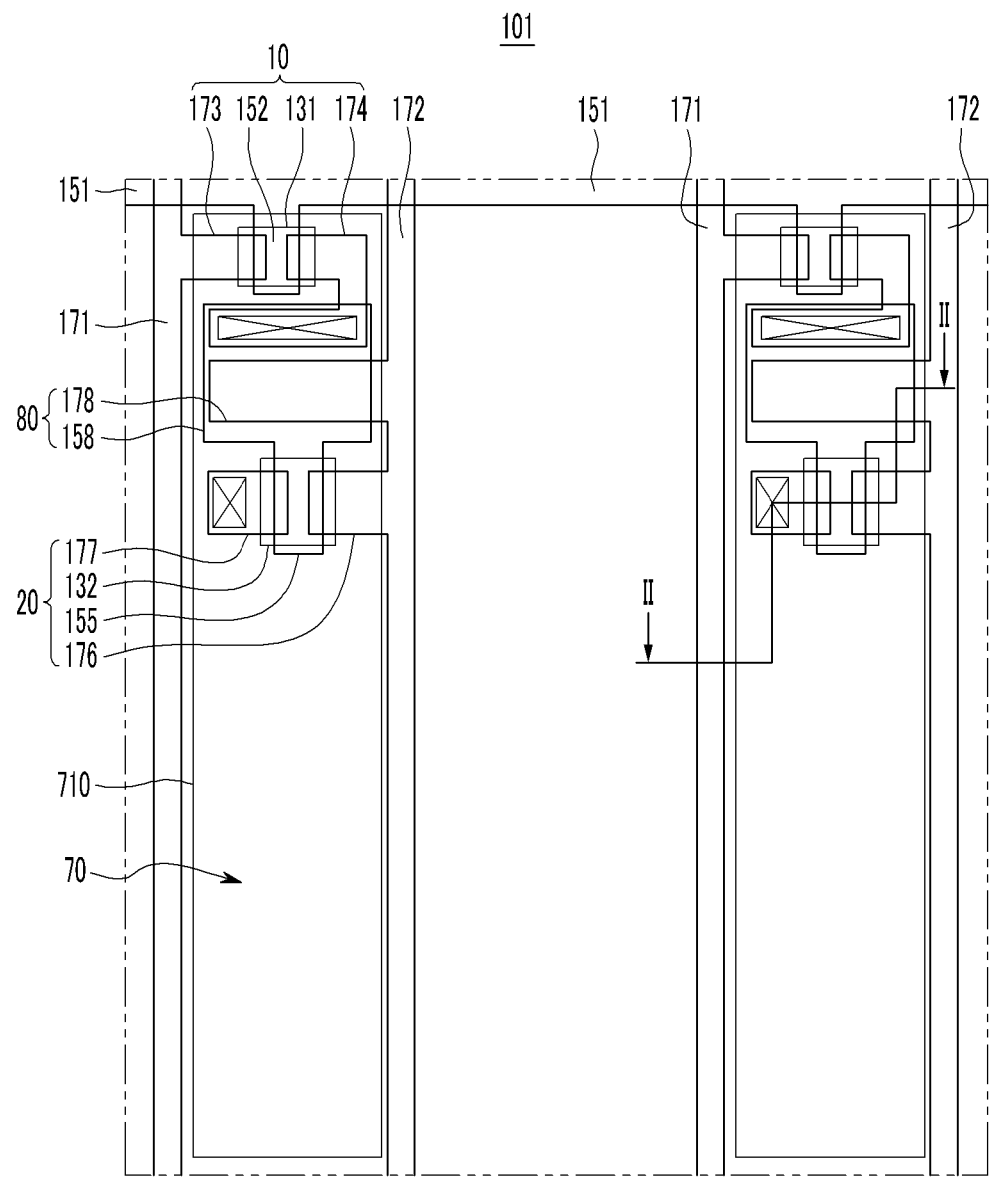
FIG. 1 is a layout view of a pixel circuit of an embodiment of an organic light emitting diode (OLED) display.

Hereinafter, certain embodiments will be described more fully with reference to the accompanying drawings. As those skilled in the art would realize, the described embodiments can be modified in various ways, without departing from the spirit or scope of the claims. Like reference numerals generally designate like elements throughout the specification.

The size and thickness of each component shown in the drawings are arbitrarily shown for understanding and ease of description, but embodiments are not limited thereto. In the drawings, the thickness of layers, films, panels, regions, etc., can be exaggerated for clarity, better understanding and ease of description. It will be understood that when an element such as a layer, film, region, or substrate is referred to as being "on" another element, it can be directly on the other element or intervening elements may also be present.

In small organic light emitting diode (OLED) displays of less than 10 inches, the distance between the central portion and the outer portion is relatively small, such that the influence of a voltage drop is small even if a transparent cathode is used. However, this distance is relatively large in organic light emitting diode (OLED) displays of more than 10 inches, and thereby long range uniformity (LRU) of the luminance is disturbed due to the voltage drop. To solve this problem, the common voltage ELVss applied to the cathode can be decreased such that the driving voltage margin of the organic light emitting emitter can be widened. Such a decrease in the driving voltage margin may however increase power consumption.

The front light emitting type generally has a good life-span characteristic, but due to the high resistance of the cathode, a voltage drop can be generated in the cathode.

Figure 2:
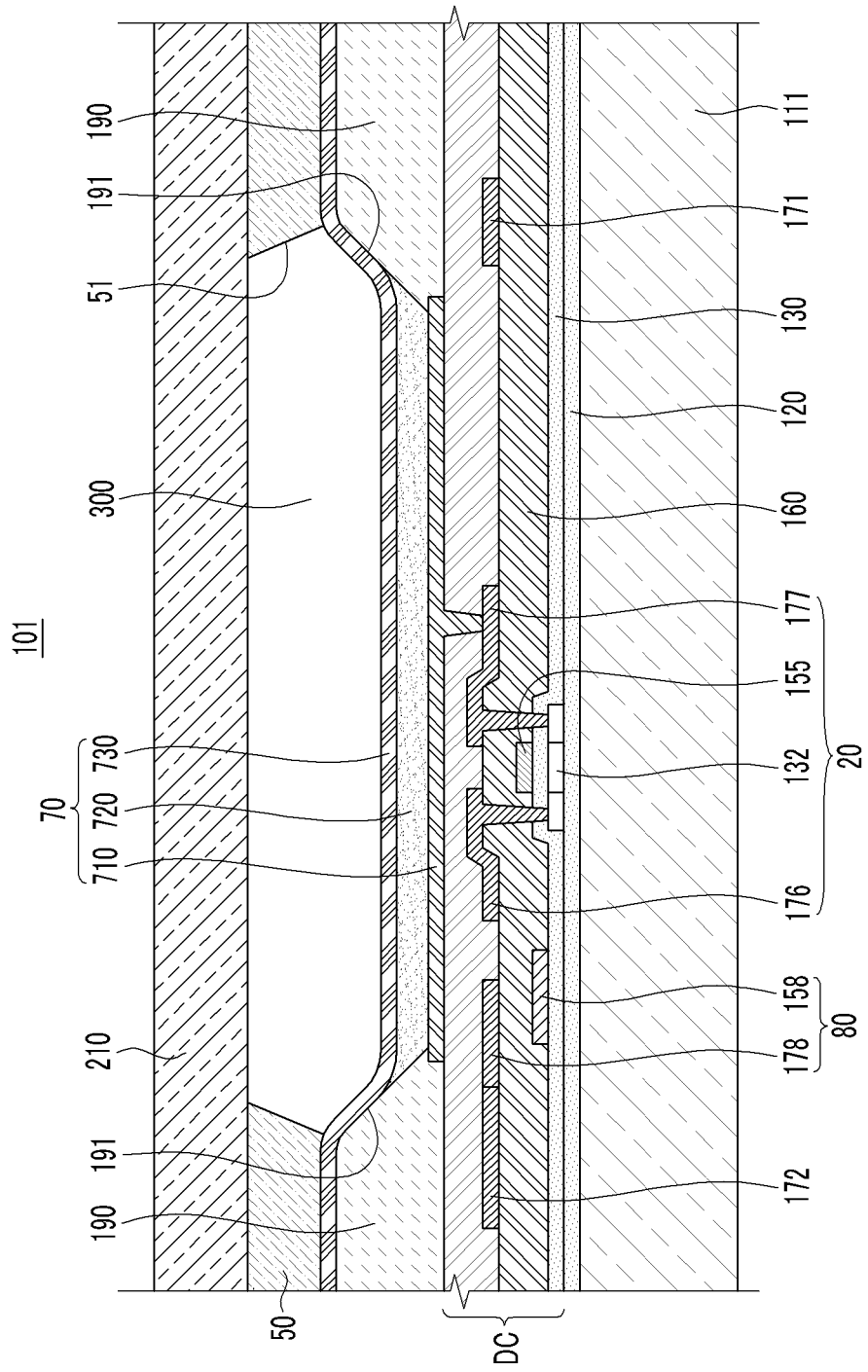
FIG. 2 is a cross-sectional view taken along line II-II FIG. 1.

FIG. 1 is a layout view of a pixel circuit of an embodiment of an organic light emitting diode (OLED) display, and FIG. 2 is a cross-sectional view taken along line II-II of FIG. 1. Referring to FIG. 1 and FIG. 2, an embodiment of an OLED display 101 includes a substrate main body 111, a driving circuit DC, an organic light emitter 70, an assistance electrode 50, and an encapsulation substrate 210. In addition, the OLED display 101 may further include a buffer layer 120 and a pixel defining layer 190.

In some embodiments, the substrate main body 111 can be formed of an insulating substrate made of glass, quartz, ceramic, or the like. In other embodiments, the substrate main body can be made of a flexible substrate such as plastic. In yet other embodiments, the substrate main body 111 can be made of a metallic substrate made of stainless steel.

The buffer layer 120 is disposed on the substrate main body 111. The buffer layer 120 can be formed of at least one of various inorganic and organic layers. The buffer layer 120 helps prevent penetration of unnecessary components, such as impurity elements or moisture, into the driving circuit DC and/or the organic light emitter 70, and also planarizes the surface of the substrate main body. The buffer layer can be omitted in some embodiments, depending on the type and processing conditions of the substrate main body 111.

The driving circuit DC is formed on the buffer layer 120. The driving circuit DC includes a plurality of thin film transistors 10 and 20, and drives the organic light emitter 70. That is, the organic light emitter 70 emits light according to a driving signal transmitted from the driving circuit DC to display an image.

The organic light emitter 70 includes a first electrode 710, which be an anode injecting holes, a second electrode 730, which can be a cathode injecting electrons, and an organic emission layer 720 disposed between the first and second electrodes 710 and 730. The first electrode 710, the organic emission layer 720, and the second electrode 730 are sequentially stacked such that the organic light emitter 70 is formed. In other embodiments, the first electrode 710 may function as the cathode and the second electrode 730 may function as the anode.

In some embodiments, the first electrode 710 forms a reflective layer and the second electrode 730 forms a transflective layer. Light emitted from the organic emission layer 720 is passed through the second electrode 730 and then emitted. In such embodiments, the OLED display 101 has a front emission type of structure.

The reflective layer and the transflective layer can be formed using at least one of magnesium (Mg), silver (Ag), gold (Au), calcium (Ca), lithium (Li), chromium (Cr), and aluminum (Al), or an alloy thereof. In some embodiments, the reflective layer and the transflective layer properties are determined by their respective thickness. Light transmittance of the transflective layer is increased as the thickness thereof is decreased, and it is decreased as the thickness thereof is increased.

The first electrode 710 may further include a transparent conductive layer (not shown). In some embodiments, the first electrode 710 may have a multi-layered structure including a reflective layer and a transparent conductive layer. The transparent conductive layer of the first electrode 710 can be interposed between the reflective layer and the organic emission layer 720. In other embodiments, the first electrode 710 may have a triple-layered structure with a transparent conductive layer, a reflective layer, and a transparent conductive layer that are stacked sequentially (not shown)

The transparent conductive layer can be made of a material such as indium tin oxide (ITO), indium zinc oxide (IZO), zinc oxide (ZnO), or indium oxide (In2O3). The transparent conductive layer 712 has a relatively high work function. Therefore, in embodiments where the first electrode 710 includes the transparent conductive layer, smooth hole injection can be performed through the first electrode 710.

The second electrode 730 can be formed of a transparent conductive layer. In such embodiments, the second electrode 730 may function as an anode for hole injection (not shown). In one embodiment, the first electrode 710 can be the cathode made of only the reflective layer.

The organic emission layer 720 can be formed as a multi-layered structure with an emissive layer (EML) generating red, green, and blue light, a hole-injection layer (HIL), a hole-transporting layer (HTL), an electron-transporting layer (ETL), and an electron-injection layer (EIL). In various embodiments, except for the emissive layer (EML), the layers forming the organic emission layer 720 can be omitted as necessary. In embodiments where the organic emission layer 720 includes all the above-stated layers, the hole injection layer (HIL) can be disposed on the first electrode 710 which is the anode, and the hole transport layer (HTL), the emissive layer, the electron transport layer (ETL), and the electron injection layer (EIL) can be sequentially disposed thereon. The organic emission layer 720 may include other layers as necessary.

The pixel definition layer 190 has an opening 191. The opening 191 of the pixel definition layer 190 exposes a portion of the first electrode 710. In the opening 191 of the pixel definition layer 190, the first electrode 710, the organic emission layer 720, and the second electrode 730 are sequentially deposited. The second electrode 730 is further formed on the pixel definition layer 190 as well as the organic emission layer 720. The other layers except for the emissive layer (EML) among the multi-layered structure of the organic emission layer 720 can be disposed between the pixel definition layer 190 and the second electrode 730. The organic light emitter 70 emits the light in the organic emission layer 720 disposed inside the opening 191 of the pixel definition layer 190. In some embodiments, the opening 191 of the pixel definition layer 190 defines the light emitting region.

The encapsulation substrate 210 can be formed of an insulating substrate made of glass, quartz, ceramic, plastic, or the like. The encapsulation substrate 210 is combined and sealed with the substrate main body 111, thereby covering and protecting the organic light emitter 70. Here, the encapsulation substrate 210 and the organic light emitter 70 are separated from each other. The space between the encapsulation substrate 210 and the substrate main body 111 can be sealed by a sealant 230 (see FIG. 4). Further, an air layer 300 is formed in the space between the encapsulation substrate 210 and the organic light emitter 70.

A structure of a driving circuit DC and an organic light emitter 70 will be described. FIG. 1 and FIG. 2 show an active matrix (AM) organic light emitting diode (OLED) display 101 of a 2Tr-1Cap structure in which one pixel includes two thin film transistors (TFT) 10 and 20, and one capacitor 80. Other embodiments of the organic light emitting diode display 101 can be provided with three or more thin film transistors and two or more storage capacitors in one pixel, and can be configured to have various structures with additional wires. A pixel represents a base unit for displaying an image and is disposed in each pixel area, and the organic light emitting diode display 101 displays an image through a plurality of pixels.

As shown in FIG. 1 and FIG. 2, a switching thin film transistor 10, a driving thin film transistor 20, a storage capacitor 80, and an organic light emitting diode (OLED) 70 are formed on the substrate main body 111 for each pixel. A configuration including the switching thin film transistor 10, the driving thin film transistor 20, and the storage capacitor 80 may form a driving circuit DC.

The substrate further includes a gate line 151 disposed in one direction, a data line 171 insulating and crossing the gate line 151, and a common power supply line 172. In some embodiments, one pixel can be defined by the boundaries of the gate line 151, the data line 171, and the common power supply line 172.

The organic light emitter 70 includes the first electrode 710, the organic emission layer 720 formed on the first electrode 710, and the second electrode 730 formed on the organic emission layer 720. Holes and electrodes are injected into the organic emission layer 720 from each of the first electrode 710 and the second electrode 730. When excitons generated by combination of the injected holes and electrons in the organic emission layer are transitioned from an excited state to a ground state, light is emitted.

The storage capacitor 80 includes a pair of capacitor plates 158 and 178 with an interlayer insulating layer 160 interposed therebetween. The interlayer insulating layer 160 functions as a dielectric. Storage capacity is determined by electric charges stored in the storage capacitor 80 and a voltage difference between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 serves as a switching element that selects a desired pixel to emit light. The switching gate electrode 152 is connected to the gate line 151. The switching source electrode 173 is connected to the data line 171. The switching drain electrode 174 is disposed away from the switching source electrode 173 and is connected to one capacitor plate 158.

The driving thin film transistor 20 applies the first common voltage (ELVdd) to allow the organic emission layer 720 of the organic light emitter 70 to emit light in the selected pixel to the first electrode 710. The driving gate electrode 155 is connected to the capacitor plate 158 connected with the switching drain electrode 174. The driving source electrode 176 and the other capacitor plate 178 are connected to the common power source line 172. The driving drain electrode 177 is connected to the first electrode 710 of the organic light emitting emitter 70 through a contact hole.

The switching thin film transistor 10 is operated by a gate voltage applied to the gate line 151 serving to transmit a data voltage applied to the data line 171 to the driving thin film transistor 20. A voltage corresponding to a difference between a common voltage applied to the driving thin film transistor 20 from the common power supply line 172 and the data voltage transmitted from the switching thin film transistor 10 is stored in the storage capacitor 80. A current corresponding to the voltage stored in the storage capacitor 80 flows to the organic light emitter 70 through the driving thin film transistor 20 to allow the organic light emitter 70 to emit light.

In other embodiments, the structure of the thin film transistors 10 and 20 and organic light emitter 70 can be modified by a person skilled in the art.

A gate insulating layer 130 is formed on the driving semiconductor layer 132 and the buffer layer 120, and thereby the driving semiconductor layer 132 and the driving gate electrode 155 are insulated from each other.

The common power line 172 is connected to the driving source electrode 176 of the driving thin film transistor 20, thereby applying the common voltage to the first electrode 710 of the organic light emitter 70 through the driving thin film transistor 20. The second electrode 730 of the organic light emitting emitter 70 is applied with the second common voltage ELVss.

In one embodiment of the organic light emitting diode (OLED) display 101, the first electrode 710 and the second electrode 730 are applied with the first and second common voltages ELVdd and ELVss, and when the current flows from the first electrode 710 to the second electrode 730 through the organic emission layer 720, to minimize the drop of the second common voltage ELVss in the second electrode 730, the assistance electrode 50 is disposed between the encapsulation substrate 210 and the second electrode 730. The assistance electrode 50 can provide increased resistance between the encapsulation substrate 210 and the second electrode 730 so that the voltage drop across the second electrode is less abrupt.

In some embodiments, the assistance electrode 50 is formed on the inner surface of the encapsulation substrate 210 such that it corresponds to the non-light emitting region determined between neighboring organic light emitters 70. The assistance electrode 50 can be made of a metallic material having lower resistance than the second electrode 730 such that the drop of the second common voltage ELVss can be minimized in the second electrode 730. The assistance electrode 50 can be formed with a thickness T2 larger than the first thickness T1 of the second electrode 730, and thereby the drop of the second common voltage ELVss can be reduced in the second electrode 730 when it is formed with the same material as the second electrode 730.

Figure 3:
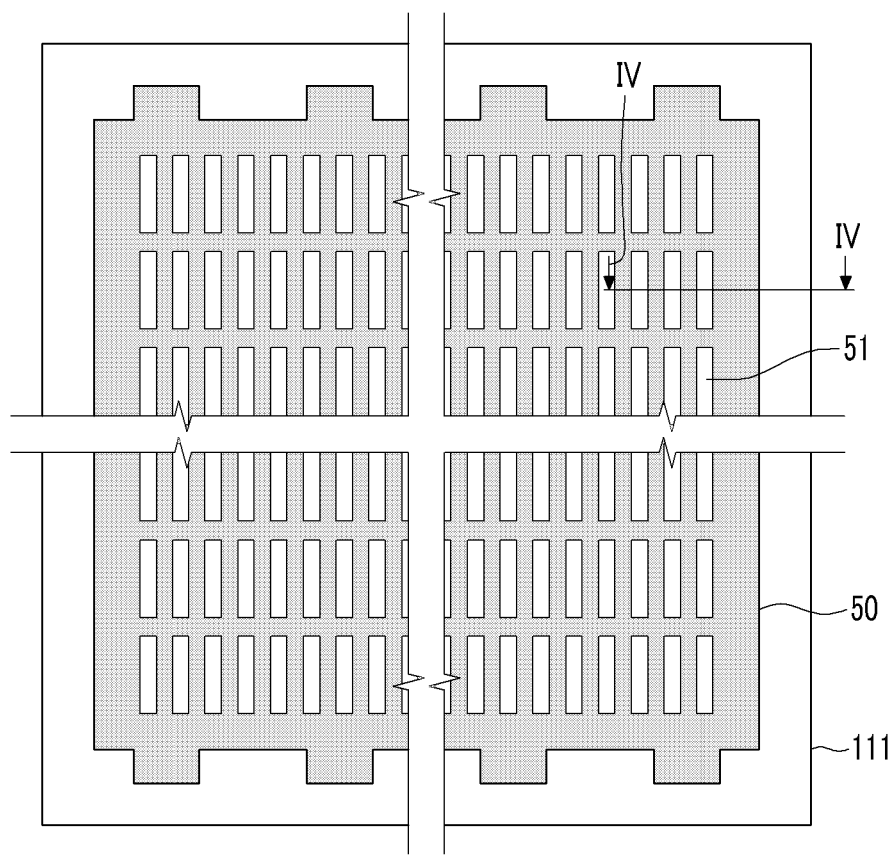
FIG. 3 is a top plan view of an assistance electrode pattern formed in an encapsulation substrate in the embodiment of an organic light emitting diode (OLED) display of FIG. 1.

FIG. 3 is a top plan view of an assistance electrode pattern formed in an encapsulation substrate in an embodiment of the organic light emitting diode (OLED) display of FIG. 1. Referring to FIG. 3, the assistance electrode 50 has a mask structure corresponding to the pattern of the non-light-emitting region such that a front light emitting type is made possible. An opening 51 of the assistance electrode 50 corresponds with the opening 191 of the pixel definition layer 190 (seen in FIG. 2).

The assistance electrode 50 can be formed in the non-light-emitting region, and the light is transmitted from the organic emission layer 720 to the encapsulation substrate 210 through the opening 51 such that the assistance electrode 50 can be made of the opaque material having low resistance, and accordingly the drop of the second common voltage ELVss can be reduced in the second electrode 730. In some embodiments, the assistance electrode 50 can be formed with a black color, functioning as a black matrix such that a stitch generated by using stepper equipment for the large size panel can be removed.

Figure 4:
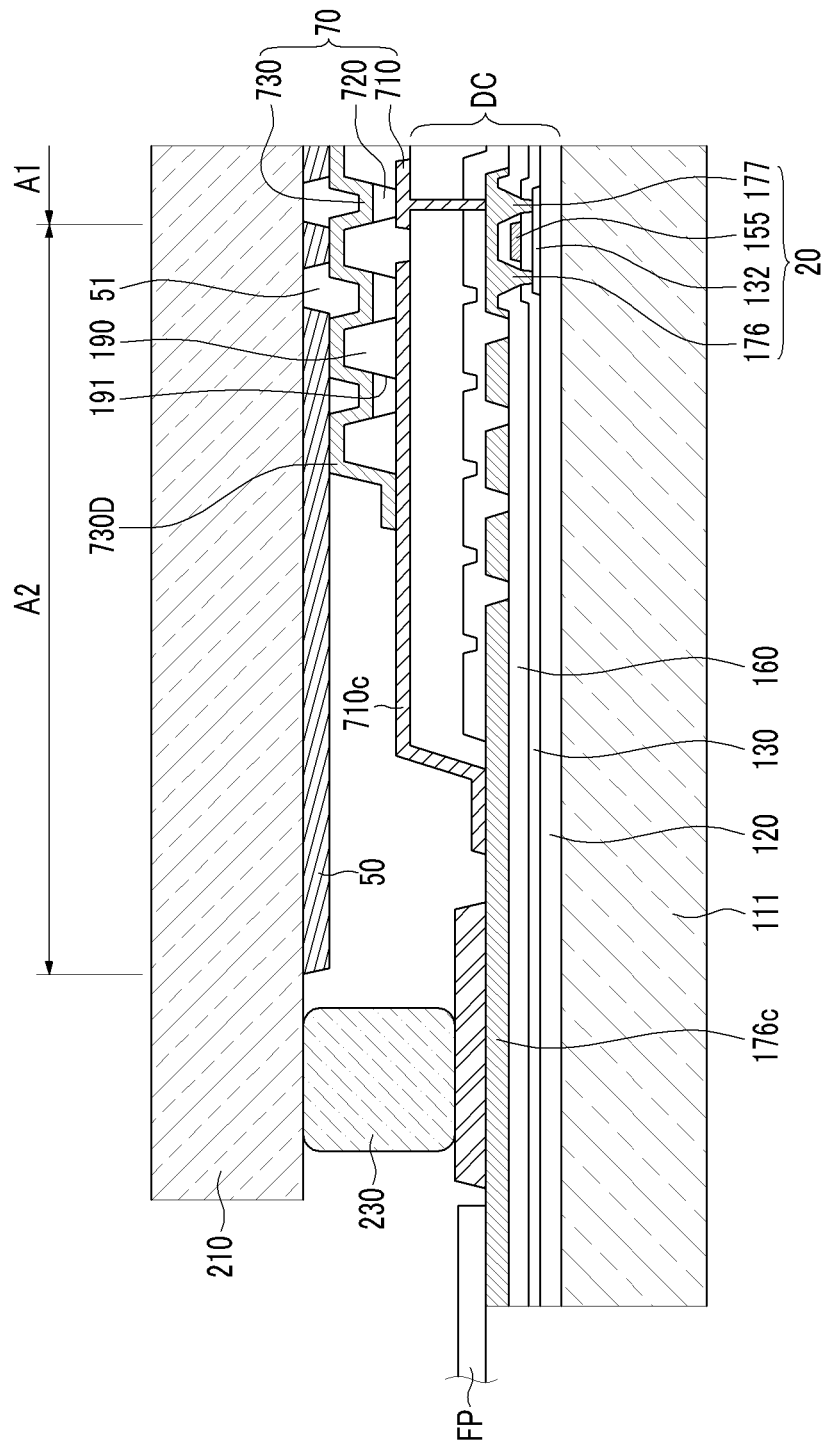
FIG. 4 is a cross-sectional view taken along the line IV-IV of FIG. 3.

FIG. 4 is a cross-sectional view taken along the line IV-IV of FIG. 3. Referring to FIG. 4, the assistance electrode 50 is formed in the pixel unit A1 realizing the image to the outer portion A2 determined on the outer part of the pixel unit A1 such that the second common voltage ELVss can be applied outside the encapsulation substrate 210. Accordingly, most of the current flows through the assistance electrode 50 of the second electrode 730 having the relative high resistance such that the drop of the second common voltage ELVss can be minimized.

In some embodiments, the assistance electrode 50 is integrally formed throughout the pixel unit A1 and the outer portion A2. The assistance electrode 50 is connected to the second electrode 730 in the pixel unit A1, and is connected to a first connection 710c in the outer portion A2. The first connection 710c is electrically disconnected from the first electrode 710 in the first electrode layer and is formed in the outer portion A2. That is, the first connection 710c is elongated on the upper and the lower surfaces of the driving circuit unit DC.

The second electrode 730 further includes a dummy portion 730D connected from the pixel unit A1 and formed at the outer portion A2. Accordingly, one side of the dummy portion 730D is connected to the assistance electrode 50, and the other side thereof is connected to the first connection 710C in the outer portion A2.

The first connection 710c is connected to the pad FP of the flexible printed circuit (FPC) that is an outer power source terminal through a second connection 176c. The second connection 176C is electrically disconnected from the driving source electrode 176 and the driving drain electrode 177 in the source/drain electrode layer of the driving circuit unit DC such that it is formed on the substrate main body 111 outside the encapsulation substrate 210. The second connection 176C is connected to the pad FP of the flexible printed circuit FPC outside the encapsulation substrate 210.

Accordingly, when the organic light emitter 70 emits light, the current flowing from the first electrode 710 to the second electrode 730 flows to the outer portion A2 of the pad FP of the flexible printed circuit FPC from the pixel unit A1 through the assistance electrode 50 and the first and second connections 710c and 176c as the wire having low resistance.

A connection portion of the high resistance passing the dummy portion 730D in the assistance electrode 50 of the outer portion A2 and arriving at the first connection 710c forms the shortest length passing through the second electrode 730, and the path is formed of the assistance electrode 50 having the low resistance such that the drop of the second common voltage ELVss applied to the second electrode 730 can be reduced.

The drop of the second common voltage ELVss can be reduced in the second electrodes 730 of the pixel unit A1 positioned far from the pad FP of the flexible printed circuit FPC, through the second and first connections 176c and 710c. Accordingly, the long range uniformity of the luminance can be improved in the pixel unit A1, and the driving voltage margin of the organic light emitter 70 can be reduced such that the power consumption can be decreased.

Conventionally, the second electrode and the first electrode are typically directly connected to each other in the outer portion. In such arrangements, a lot of heat can be generated in the connection portion of the second electrode and the first electrode due to the high resistance of the second electrode. In certain embodiments disclosed herein, the assistance electrode 50 of the low resistance is connected to the first connection 710c through the dummy portion 730D, such that the heat in this portion can be reduced.

Figure 5:
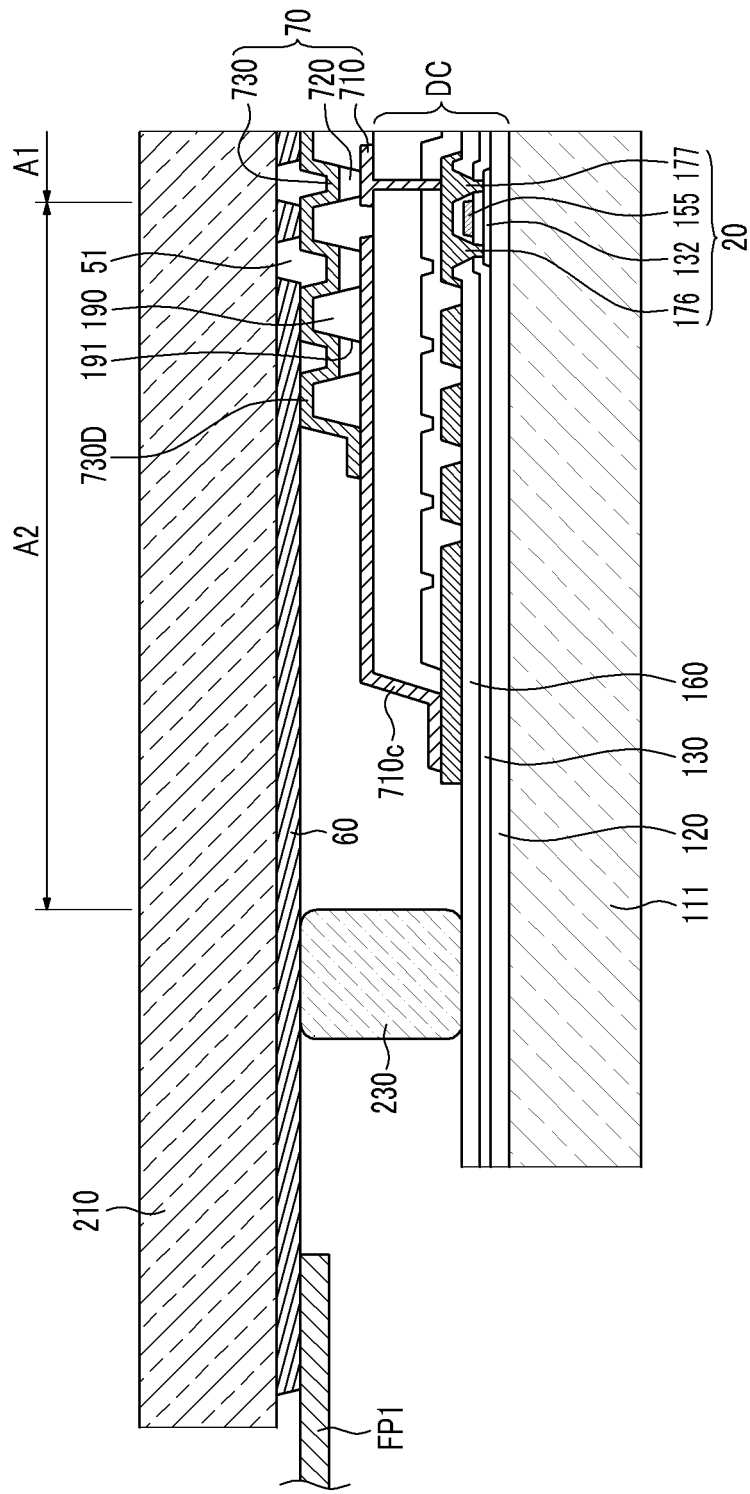
FIG. 5 is a cross-sectional view of another embodiment of an organic light emitting diode (OLED) display.

FIG. 5 is a cross-sectional view of another embodiment of an organic light emitting diode (OLED) display. In this embodiment, there is a connection relation between an assistance electrode and a pad of a flexible printed circuit (FPC).

As shown in FIG. 5, an assistance electrode 60 having the same basic structure as that of the above described embodiment is extended such that the assistance electrode 60 passes a sealant 230 from the outer portion A2 on the encapsulation substrate 210.

Accordingly, the portion of the assistance electrode 60 connected to a pad FP1 of a flexible printed circuit is formed at the side of encapsulation substrate 210, and the second connection 176c described in the previous embodiment can be omitted.

Certain embodiments disclosed provide an organic light emitting diode (OLED) display improving long range uniformity of the luminance by minimizing the voltage drop in the cathode (the second electrode) and reducing power consumption by decreasing a driving voltage margin of the organic light emitting emitter.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
a substrate main body;
a driving circuit formed over the substrate main body;
a plurality of organic light emitters spaced apart from one another by a non-light emitting region, each organic light emitter comprising a first electrode and an organic emission layer, and a second electrode covering the plurality of first electrodes and organic emission layers; wherein the first electrode, the organic emission layer and the second electrode are sequentially deposited on the driving circuit;
an encapsulation substrate covering the plurality of organic light emitters and sealed to the substrate main body; and
an assistance electrode disposed between and contacting the encapsulation substrate and the second electrode, the assistance electrode disposed in the non-light-emitting regions between the plurality of organic light emitters, wherein the assistance electrode has a lower resistance than the second electrode, and wherein the assistance electrode is connected to the second electrode in a pixel region, a first connection is spaced apart from the first electrode into an area outside the pixel region, the first connection is electrically connected to a second connection spaced apart from a source electrode and a drain electrode of the driving circuit, and the second connection is electrically connected to a flexible printed circuit (FPC) outside the encapsulation substrate.

2. The organic light emitting diode (OLED) display of claim 1, wherein the assistance electrode comprises a metallic material.

3. The organic light emitting diode (OLED) display of claim 1, wherein the assistance electrode is thicker than the second electrode.

4. The organic light emitting diode (OLED) display of claim 1, wherein the assistance electrode comprises a mesh structure corresponding to the pattern of the non-light-emitting region.

5. The organic light emitting diode (OLED) display of claim 1, wherein the second electrode further includes a dummy portion electrically connected to the pixel region and formed in an area outside the pixel region.

6. The light emitting diode (OLED) display of claim 5, wherein the dummy portion is electrically connected to the assistance electrode and to the first connection.

7. The organic light emitting diode (OLED) display of claim 1, wherein the assistance electrode comprises an opaque material.

8. The organic light emitting diode (OLED) display of claim 1, wherein the assistance electrode comprises a black color.

9. An organic light emitting diode (OLED) display comprising:
a plurality of organic light emitters spaced apart from one another by a non-light emitting region, each organic light emitter comprising a first electrode and an organic emission layer, and a second electrode covering the plurality of first electrodes and organic emission layers;
an encapsulation substrate covering the plurality of organic light emitters;
an assistance electrode disposed between and contacting the encapsulation substrate and the second electrode, the assistance electrode disposed in the non-light-emitting regions between the plurality of organic light emitters, wherein the assistance electrode has a lower resistance than a resistance of the second electrode and wherein the assistance electrode is connected to the second electrode in a pixel region, a first connection is spaced apart from the first electrode into an area outside the pixel region, the first connection is electrically connected to a second connection spaced apart from a source electrode and a drain electrode of the driving circuit, and the second connection is electrically connected to a flexible printed circuit (FPC) outside the encapsulation substrate.

10. The organic light emitting diode (OLED) display of claim 9, wherein the assistance electrode comprises a metallic material.

11. The display of claim 9, wherein the assistance electrode is thicker than the second electrode.

12. The display of claim 9, wherein the assistance electrode comprises a mesh structure corresponding to a pattern of the non-light-emitting region.

13. The display of claim 9, wherein the second electrode further includes a dummy portion electrically connected to the pixel region and formed in an area outside the pixel region.

14. The display of claim 13, wherein the dummy portion is electrically connected to the assistance electrode and to the first connection.

15. The display of claim 9, wherein the assistance electrode comprises an opaque material.

16. The display of claim 9, wherein the assistance electrode comprises a black color.

* * * * *